(12) United States Patent
Reiss et al.

(10) Patent No.: US 7,256,070 B2
(45) Date of Patent: Aug. 14, 2007

(54) SUBSTRATE-BASED HOUSING COMPONENT WITH A SEMICONDUCTOR CHIP

(75) Inventors: Martin Reiss, Dresden (DE); Anton Legen, Munich (DE); Manuel Carmona, Munich (DE); Kerstin Nocke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/155,317

(22) Filed: Jun. 17, 2005

(65) Prior Publication Data

US 2006/0049503 A1 Mar. 9, 2006

(30) Foreign Application Priority Data

Jun. 18, 2004 (DE) .................... 10 2004 029 586

(51) Int. Cl.
*H01L 21/00* (2006.01)
(52) U.S. Cl. .................. 438/108; 257/778; 257/784; 257/774
(58) Field of Classification Search ........ 257/737–738, 257/780, 678, 721, 787–789, 795, 777–778, 257/774, 782–784, E23.145; 438/108, 112, 438/124, 118, 126–127, 617
See application file for complete search history.

(56) References Cited

U.S. PATENT DOCUMENTS

| 4,868,349 | A | | 9/1989 | Chia | |
|---|---|---|---|---|---|
| 5,659,199 | A | | 8/1997 | Mori et al. | |
| 5,842,275 | A | * | 12/1998 | McMillan et al. | 29/840 |
| 6,054,755 | A | * | 4/2000 | Takamichi et al. | 257/667 |
| 6,531,763 | B1 | * | 3/2003 | Bolken et al. | 257/667 |
| 6,531,766 | B1 | * | 3/2003 | Taniguchi et al. | 257/678 |
| 6,780,681 | B2 | * | 8/2004 | Aoki | 438/124 |
| 6,787,443 | B1 | * | 9/2004 | Boggs et al. | 438/612 |
| 6,925,875 | B2 | * | 8/2005 | Silverbrook | 73/493 |
| 2003/0111719 | A1 | | 6/2003 | Reiss et al. | |

FOREIGN PATENT DOCUMENTS

| DE | 39 10707 A1 | 11/1989 |
|---|---|---|
| DE | 196 18 976 A1 | 5/1997 |
| DE | 197 41 437 A1 | 4/1999 |
| DE | 101 27 010 A1 | 12/2002 |
| DE | 101 62 676 A1 | 7/2003 |

* cited by examiner

*Primary Examiner*—Mary Wilczewski
*Assistant Examiner*—Thanh Y. Tran
(74) *Attorney, Agent, or Firm*—Slater & Matsil, L.L.P.

(57) ABSTRACT

The invention, which relates to an electronic component with a semiconductor chip, which is connected to a carrier substrate and surrounded by a housing, is based on presenting a substrate-based, housed electronic component, which enables the continuous release of the internal vapor pressure arising when the electronic component is heated, and at the same time can be produced inexpensively using the known and tried-and-tested methods and materials. According to embodiments of the invention, this is achieved by virtue of the fact that the carrier substrate comprises a plurality of hollow vias open on both sides, which vias are distributed areally in at least one section of the carrier substrate that is covered by the housing.

10 Claims, 1 Drawing Sheet

SUBSTRATE-BASED HOUSING COMPONENT WITH A SEMICONDUCTOR CHIP

This application claims priority to German Patent Application 10 2004 029 586.7, which was filed Jun. 18, 2004, and is incorporated herein by reference.

TECHNICAL FIELD

The invention relates to an electronic component with a semiconductor chip, which is connected to a carrier substrate and surrounded by a housing.

BACKGROUND

Such housed electronic components (packages) are known, for example, as chip size packages, as multichip modules, or as BGA components. They essentially comprise one or more semiconductor chips, which are mechanically mounted and electrically contact-connected on a carrier substrate. For this purpose, a semiconductor chip is located on one side of the carrier substrate. Through-plating leads extend through the carrier substrate as far as its second side. Electrical external contacts on the second side of the carrier substrate are used contact the package to a circuit board. Conductor tracks are furthermore arranged on the second or, if necessary, on both sides of the carrier substrate, by means of which conductor tracks the various contact areas are connected to one another in such a way that the external contacts are electrically contact-connected to the corresponding contacts of the semiconductor chip.

The through-plating may be embodied in various ways according to the embodiment of the electrical contacts of the semiconductor chip and the mechanical mounting thereof on the carrier substrate. By way of example, in the case of central contact rows and in the case where the semiconductor chip is mounted with the active side downward (face-down), the carrier substrate has a single, relatively large passage (bonding channel) in the central region of the carrier substrate. The through-plating is equally possible by means of a relatively large number of areally distributed through contacts, in the form of metallized holes in the carrier substrate.

In order to protect the semiconductor chip against ambient influences and against damage during the further processing of the package, the semiconductor chip is surrounded by a housing. This is effected, for example, by means of a potting composition in an injection molding method, so that the entire electronic component with the exception of the electrical external contacts is sealed by a plastic composition.

An ingress of moisture, dependent on the respective materials, into the package is also always associated with the various material components of such a package, the carrier substrate, the housing material and, if appropriate, the adhesive material for fixing the semiconductor chip on the carrier substrate. Moreover, water vapor constantly diffuses through the housing into the interior thereof or small quantities of water penetrate along the connecting areas between the housing and the carrier substrate. Both the residual moisture that has remained in the package and the water vapor that constantly penetrates from outside under a normal atmosphere lead to disturbances or else to the failure of the package, particularly if the package is exposed to elevated temperatures as is effected for example during the soldering process for the integration of the package. On account of the water content in the package and the elevated temperature, vapor pressure is developed in the housing if the water vapor cannot emerge from the housing in a timely manner. The internal pressure, which thus builds up, can lead to the destruction of the housing and consequently of the package as a result of the known popcorn effect, and to delamination along the contact area of the housing with the carrier substrate.

In order to assess the residual moisture present in the package and the associated possible storage of the package under a normal atmosphere, which means without particular measures for keeping it dry such as, for example, without dry packaging, the packages are subjected to various loading tests and, with conclusions being drawn therefrom, are assigned to corresponding classifications, the so-called moisture sensitivity levels. Particularly during soldering processes using lead-free solder, which proceed at relatively high temperatures, it is necessary to use packages having the highest classification level, MSL1/260° C. These packages have to withstand, without damage, being artificially stored for several days at 85° C. and 85% relative air humidity and a subsequent soldering simulation at 260° C.

In order to reduce the water content, special materials are used for mounting and housing. Thus, by way of example, a potting composition for producing the housing with a relatively high proportion of filler is used since the water absorption of the potting composition can thus be significantly reduced. German Patent Application No. 197 41 437 A1 describes the use of a potting composition whose basic epoxy resin is based on a biphenyl structure so that the potting composition is distinguished by low water absorption besides a high proportion of filler. In order to reduce delamination, moreover, the semiconductor chip is provided with a buffer layer made of polybenzoxazole on its side facing the potting composition, which buffer layer is intended to bring about a good adhesion imparted between the materials of the chip and the potting composition and thus the reduction of the ingress of water in this region.

However, these measures relate only to the potting composition and the contact thereof with respect to the semiconductor chip and cannot be applied to the connection of both materials to a carrier substrate or to other housing embodiments. This is because, particularly when glass-fiber-reinforced epoxy resin is used, capillary acting moisture paths arise along the glass fibers, and they cannot be prevented by selected mounting materials either. These moisture paths have particularly disadvantageous effects if the semiconductor chip is adhesively bonded on such a carrier substrate since the adhesive material has a high proportion of water-absorbing polymer that cannot be reduced by a filler without impairing the adhesive properties.

If the carrier substrate itself also has a specific water content, which may occur in the case of plastic substrates, the carrier substrate also participates in the ingress of moisture into the package and is affected by the damaging popcorn effect and delamination.

On account of the changing number of material components involved in the package, their further requirements that principally have to be satisfied with regard to their electrical, mechanical and also thermal properties and their compatibility with one another, an initial ingress of moisture is practically unavoidable. Subsequent drying, just like preventing the ingress of water or water vapor, is also associated with an increased outlay in respect of time and materials and is, therefore, not a practicable solution particularly on account of rising production numbers.

SUMMARY OF THE INVENTION

Therefore, embodiments of the invention present a substrate-based, housed electronic component that enables the continuous release of the internal vapor pressure arising when the electronic component is heated, and at the same time can be produced inexpensively using the known and tried-and-tested methods and materials.

According to embodiments of the invention, advantages are achieved by virtue of the fact that the carrier substrate comprises a plurality of hollow vias open on both sides, which vias are distributed areally in at least one section of the carrier substrate that is covered by the housing.

Embodiments of the invention prevent a critical vapor pressure from arising through targeted relief of pressure by means of vias that are to be dimensioned and arranged in optimized fashion during the evaporation of the water component present, which represents a departure from the described endeavors to prevent a critical vapor pressure from arising by preventing or at least reducing the water absorption. For this purpose, the vias have the form of channels and, on account of their arrangement in the carrier substrate, which terminates the package areally in its usually largest extent toward the surrounding atmosphere, can project right into the central region of the housing and thus realize diffusion paths that are short in distributed fashion in accordance with the vapor evolution to be expected.

The holes for the vias and blind vias can be produced very cost-effectively using existing equipment and, if the holes for the electrical through-contacts correspond to those of the vias and blind vias, without an additional process step.

DESCRIPTION OF THE DRAWINGS

The invention will be explained in more detail below on the basis of an exemplary embodiment. In the associated drawing.

The following list of reference symbols can be used in conjunction with the figures:

| | |
|---|---|
| 1 | Semiconductor chip |
| 2 | Contact rows |
| 3 | Adhesive material |
| 4 | Carrier substrate |
| 5 | Passage |
| 6 | Wire bridges |
| 7 | Contact areas |
| 8 | Conductor track structure |
| 9 | Solder ball |
| 10 | Soldering resist mask |
| 11 | Vias or blind vias |
| 12 | Bottommost boundary area |
| 13 | Housing |
| 14 | Encapsulation |
| 15 | Landing area of the semiconductor chip |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
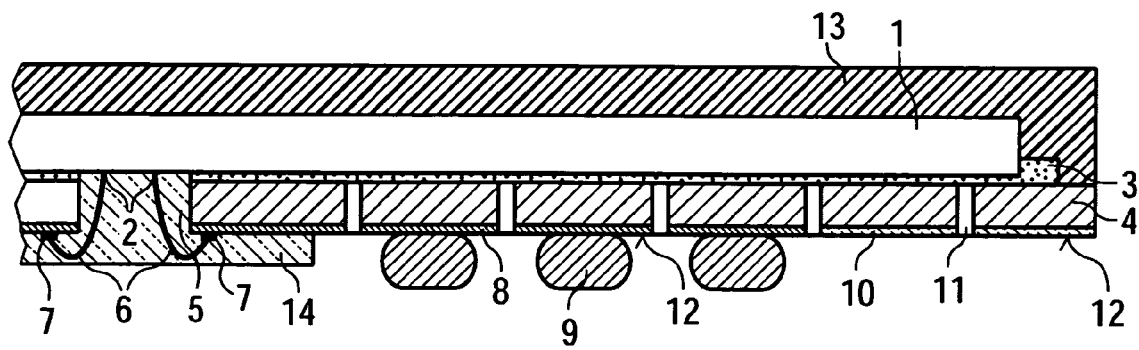
FIG. 1 shows the schematic illustration of a package according to the invention in vertical section.

The package in accordance with FIG. 1 comprises a semiconductor chip 1 with double central contact rows 2, which is adhesively bonded with the active side downward (face-down) over the whole area by means of an adhesive material 3 on the top side of a carrier substrate 4. The carrier substrate 4 is slightly larger than the semiconductor chip 1 and has in its central region a passage 5, which encloses the central contact rows 2 of the semiconductor chip 1 and through which the contact rows 2 of the semiconductor chip 1 are connected by means of wire bridges 6 to contact areas 7 arranged on the underside, the side remote from the semiconductor chip 1, of the carrier substrate 4 directly beside the passage 5. By means of a conductor track structure 8, the contact areas 7 are electrically contact-connected to solder balls 9 that are likewise arranged on the underside of the carrier substrate 4. A soldering resist mask 10 is formed between the conductor track structure 8 and the carrier substrate 4 in a manner virtually completely covering the underside of the carrier substrate 4.

Besides the central passage 5, the carrier substrate 4 has uniformly areally distributed blind vias 11 extending from the interface between adhesive material 3 and carrier substrate 4 through the carrier substrate 4 as far as the bottommost boundary area 12 of the package. Depending on the arrangement of the conductor track structure 8, the bottommost boundary area 12 may be either the conductor track structure 8 or the soldering resist mask 10. In this exemplary embodiment, the blind vias 11 have no metallization and constitute an open channel from the bottommost boundary area 12 of the package as far as the adhesive material 3.

A housing 13 in the form of a potting composition with the external dimensions of the carrier substrate 4 is applied on the top side of the carrier substrate 4 and in a manner completely enclosing the semiconductor chip 1. The central passage 5 including the wire bridges 6 are also protected against damage by encapsulation 14 by means of a potting composition, this encapsulation 14 having an extent only such that none of the blind vias 11 is closed off thereby.

Figure 2:
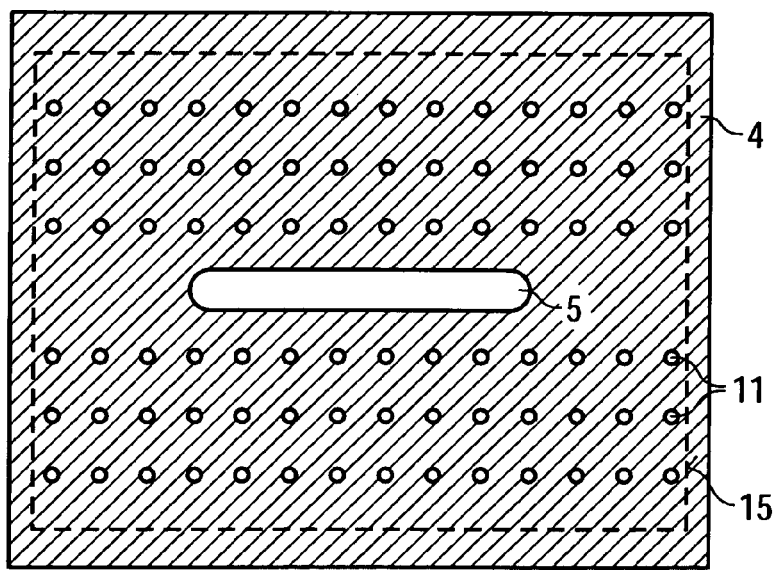
FIG. 2 shows the bottom view of the carrier substrate from FIG. 1.

FIG. 2 shows the underside of the carrier substrate 4 in accordance with FIG. 1. The central passage 5 of the carrier substrate 4, through which the wire bridges 6 are to be led from the semiconductor chip 1 on the top side as far as the contact areas 7 on the underside, has the form of a slot. The blind vias 11 according to embodiments of the invention are arranged in gridlike fashion on both sides of the passage 5 and symmetrically with respect to the center axis thereof within the landing area of the semiconductor chip 15 that is identified in FIG. 2.

These vias 11 are holes or passage openings in the carrier substrate 4 such as those that are also produced for the through-plating of the semiconductor chip 1 through the carrier substrate 4. Unlike the conductive vias, the vias 11 according to embodiments of the invention do not have an electrical function.

In order to ensure the function of the vias 11 for the vapor relief in the interior of the housing, it must be ensured during the production of the package that the vias 11 are hollow throughout as far as the material or the volume in which the vapor evolution takes place or at least as far as a layer, which permits a virtually unimpeded diffusion. Depending on how the semiconductor chip 1 is mounted on the carrier substrate 4, the package might include an adhesive material 3 by means of which the semiconductor chip 1 is adhesively bonded on the carrier substrate 4, a soldering resist mask 10 or other protective layers within the housing.

The vapor relief by means of the vias 11 that are introduced as holes into the carrier substrate 4 also makes it possible, in a particularly simple manner, to distribute them optimally in accordance with the accumulation of water vapor to be expected. In this case, the optimization is to be performed only with regard to the required adhesion area between the carrier substrate and the further mounting materials, such as adhesive composition or housing, and also with regard to the distribution of the electrical through-contacts that are furthermore required for the contact-connection of the semiconductor chip 1.

Taking account of the adhesion and the available space, the vias 11 may be distributed both uniformly and in concentrated fashion in the center or in the edge region or predominantly in the region of critical zones. The required strength of the carrier substrate 4 particularly under specific temperature and mechanical loads may also be taken into consideration in the distribution of the vias 11.

For the dimensioning of the number and the distribution of the necessary vias 11, in this case, in principle, such electrical through-contacts can also be utilized for the vapor relief and be included in the optimization insofar as the through-contacts are guaranteed to be hollow throughout.

However, it proves to be particularly advantageous in any event that the vias 11 can be produced using existing equipment and using tried-and-tested process steps.

Since the hollow vias 11 have the effect that atmospheric conditions are present at least point-by-point in accordance with their number, distribution and their cross section at the locations in the interior of the housing where the vapor evolution takes place, it is particularly advantageous, in particular for plastic substrates exhibiting a high water absorption that the vias have no metallization, i.e., are so-called blind vias. Consequently, even in the carrier substrate 4 itself, the reduction of an internal pressure is ensured by means of the vapor-relieving vias 11 since a sealing of the substrate is avoided in the region of the vias 11. Given a, for example, uniform distribution of the blind vias 11, what can thus be achieved is that the moisture paths—described in the introduction—along the glass fiber reinforcement of the substrate 4 for the most part end at the blind vias and the delamination of the carrier substrate can be prevented.

Furthermore, in the case of vias 11 having a small diameter, in practice there is the risk of closure of the vias by the metallization. However, since the vias serving for vapor relief should be hollow, the vias should be excluded from the metallization in these cases, too, in order to ensure their function according to embodiments of the invention.

Semiconductor chips 1 can be mounted particularly reliably and cost-effectively on a substrate 4 by means of adhesive bonding. Therefore, one advantageous refinement provides for the semiconductor chip 1 to be adhesively bonded onto a carrier substrate 4 having blind vias and the diameter of the blind vias to be coordinated with the viscosity of the adhesive material 3.

On account of the elastic properties of the adhesive connection 3 that are required for the reliability of the package, limits are imposed on the composition of the adhesive material 3 with regard to its water absorption. The proportion of filler that reduces the water absorption thus falls far short of being able to be set as high as in the case of the potting composition, so that the proportion of water-absorbing polymer in the adhesive material 3 is all the greater and, with the proportion thereof in the mounting materials, the proportion of moisture in the package also inevitably rises. However, the vapor relief in the interior of such a package by means of the blind vias according to embodiments of the invention has the effect that the MSL1/ 260° C. classification can be realized even with an enlarged adhesive area and adhesive thickness.

When dimensioning the diameters of the blind vias 11, however, it should be taken into account that the diameter thereof is coordinated with the viscosity of the adhesive material 3 in order to prevent the adhesive material 3 from being able to penetrate through the blind vias 11 to the opposite side of the carrier substrate from the semiconductor chip, in order to prevent contamination of the external contacts of the package that are arranged there. Relatively slight penetration of the adhesive material 3 into the blind vias 11 is harmless, on the other hand, since the atmospheric ambient conditions are present in this case, too, at the material which is to be reliably relieved of stress, and so the required path on which the moisture can leave the package with sufficient rapidity and in a sufficient quantity is thus still present.

Consequently, the diameters of the vias and of the blind vias 11 are dependent, on the one hand, on the ingress of moisture to be expected and the water absorbitivity of the individual material components, their position with respect to the outer enclosure of the component or other possible vapor relief paths, and on the viscosity of the adhesive material 3. Owing to this diverse dependence, it is favorable in accordance with one refinement of the invention if the diameters of the individual vias and/or blind vias are different and thus adapted to the respective local conditions.

On the other hand, it proves to be advantageous when the blind vias have a uniform diameter, and especially, in accordance with a further refinement, if the carrier substrate 4 has electrical through-contacts whose diameter minus their metallization approximately corresponds to that of the blind vias 11 or that of the blind vias 11 minus their metallization, if the passages through the carrier substrate 4 for producing the vias and blind vias according to embodiments of the invention are intended to be able to be produced by means of the holes that are customary for the production of electrical through-contacts.

What is claimed is:

1. A method of assembling an electronic component, the method comprising:
    providing a carrier substrate that includes a plurality of conductive vias and a plurality of hollow vias, the hollow vias being distributed over a region of area in at least one section of the carrier substrate;
    adhering a semiconductor chip to the carrier substrate; and
    wire bonding from center pads of the semiconductor chip to contact pads of the carrier substrate, the wire bonding being performed through a bond channel in the carrier substrate.

2. The method as claimed in claim 1, wherein the hollow vias comprise blind vias that are free from metallization.

3. The method as claimed in claim 2, wherein each of the hollow vias has a different diameter.

4. The method as claimed in claim 2, wherein each of the hollow vias has a uniform diameter.

5. The method as claimed in claim 1, wherein each via in the plurality of vias has a different diameter.

6. The method as claimed in claim 1, wherein each of the hollow vias has a uniform diameter.

7. The method as claimed in claim 1, wherein each of the conductive vias is formed in a via hole that has a diameter, wherein the diameter of each via hole is about equal to the uniform diameter.

8. The method as claimed in claim 1, further comprising encapsulating the semiconductor chip in a housing material.

9. The method as claimed in claim 1, wherein the semiconductor chip is electrically coupled to the carrier substrate via the conductive vias, the hollow vias having no electrical function.

10. The method as claimed in claim 1, wherein the hollow vias extend from an upper surface of the carrier substrate all the way through the carrier substrate to a lower surface of the carrier substrate.

* * * * *